United States Patent
Kim et al.

(10) Patent No.: US 11,133,821 B2
(45) Date of Patent: Sep. 28, 2021

(54) DELTA-SIGMA MODULATOR AND ANALOG-TO-DIGITAL CONVERTER INCLUDING THE SAME

(71) Applicants: Gwanak Analog CO., LTD., Seoul (KR); Seoul National University R&DB Foundation, Seoul (KR)

(72) Inventors: Suhwan Kim, Seoul (KR); Minsung Kim, Gwacheon-si (KR); Jaehoon Jun, Seoul (KR)

(73) Assignees: Gwanak Analog CO., LTD., Seoul (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/863,774

(22) Filed: Apr. 30, 2020

(65) Prior Publication Data

US 2020/0358454 A1 Nov. 12, 2020

(30) Foreign Application Priority Data

May 9, 2019 (KR) .................. 10-2019-0054314

(51) Int. Cl.
*H03M 3/00* (2006.01)
*H03M 1/12* (2006.01)
(Continued)

(52) U.S. Cl.
CPC ............. *H03M 3/43* (2013.01); *H03M 3/454* (2013.01); *H03M 3/464* (2013.01); *H03M 3/496* (2013.01);
(Continued)

(58) Field of Classification Search
CPC .......... H03M 3/30; H03M 1/12; H03M 1/804; H03M 1/06; H03M 3/322; H03M 1/38
(Continued)

(56) References Cited

U.S. PATENT DOCUMENTS 9,411,987 B2    8/2016  Alladi et al.
2016/0233872 A1*  8/2016  Wei .................. H03M 3/37

FOREIGN PATENT DOCUMENTS

KR         101200153 B1    11/2012
KR         101248563 B1     4/2013
KR      1020150127605 A    11/2015

OTHER PUBLICATIONS

Matthias Steiner et al., "A 22.3b 1kHz 12.7mW Switched-Capacitor ΔΣ Modulator with Stacked Split-Steering Amplifiers", IEEE International Solid-State Circuits Conference, ISSCC 2016, Session 15, Oversampling Data Converters, 15.8, Feb. 2, 2016, pp. 284-286.

(Continued)

*Primary Examiner* — Joseph J Lauture
(74) *Attorney, Agent, or Firm* — William Park & Associates Ltd.

(57) ABSTRACT

A delta-sigma modulator generates a bit stream signal from an analog signal by operating according to a modulation period including a sampling period and a filtering period and includes a digital-to-analog converter (DAC) configured to generate a charge signal according to one of a first reference voltage and a second reference voltage according to the bit stream signal during the sampling period and to output a signal generated according to the charge signal and the other of the first reference voltage and the second reference voltage; a loop filter configured to charge a sampling signal corresponding to the analog signal during the sampling period and to filter an output from the DAC and a signal generated according to the sampling signal during the filtering period; and a quantizer configured to generate the bit stream signal according to an output from the loop filter in the modulation period.

20 Claims, 7 Drawing Sheets

(51) Int. Cl.
  *H03M 1/80* (2006.01)
  *H03M 1/06* (2006.01)
  *H03M 1/38* (2006.01)

(52) U.S. Cl.
  CPC ............... *H03M 1/06* (2013.01); *H03M 1/12* (2013.01); *H03M 1/38* (2013.01); *H03M 1/804* (2013.01); *H03M 3/30* (2013.01); *H03M 3/322* (2013.01)

(58) Field of Classification Search
  USPC .................. 341/143, 155, 110, 172, 126
  See application file for complete search history.

(56) References Cited

OTHER PUBLICATIONS

Thije Rooijers et al., "A Quiet Digitally Assisted Auto-Zero-Stabilized Voltage Buffer with 0.6pA Input Current and 0.6 µV Offset", 2018 IEEE International Solid-State Circuits Conference, ISSCC 2018, Session 3, Analog Techniques, 3.1, Feb. 12, 2018, pp. 50-52.

* cited by examiner

<Prior Art>

DELTA-SIGMA MODULATOR AND ANALOG-TO-DIGITAL CONVERTER INCLUDING THE SAME

CROSS-REFERENCE TO RELATED APPLICATIONS

This application claims priority under 35 U.S.C. § 119(a) to Korean Patent Application No. 10-2019-0054314, filed on May 9, 2019, which is incorporated herein by reference in its entirety.

BACKGROUND

1. Technical Field

Various embodiments generally relate to a delta-sigma modulator and an analog-to-digital converter (ADC) including the same, and more particularly, to a delta-sigma modulator resilient to noise of a reference voltage and an ADC including the same.

2. Related Art

FIG. 1 is a block diagram showing an ADC including a delta-sigma modulator according to a conventional art.

The ADC includes a delta-sigma modulator 1 and a decimation filter 2 that filters noise from the bit stream signal BS output from the delta-sigma modulator 1 and outputs a digital signal D.

The delta-sigma modulator 1 includes a digital-to-analog converter (DAC) 10, a quantizer 20, an integrator 31, and a subtractor 32. The integrator 31 and the subtractor 32 may be referred to as a loop filter.

The subtractor 32 subtracts an output of the DAC 10 from an analog signal A, the integrator 31 integrates an output of the subtractor 32, and the quantizer 20 quantizes an output of the integrator 31 and outputs the bit stream signal BS.

The delta-sigma modulator 1 is widely used for an ADC because it can obtain relatively high resolution even at a low operating frequency.

In order to provide a high-resolution ADC, a noise contained in a reference voltage must be very small.

A conventional reference voltage generator and a buffer circuit that delivers the reference voltage are difficult to meet this low noise requirement.

Accordingly, the conventional delta-sigma modulator has a problem of requiring a high power consumption and a highly complex reference voltage generator and a buffer circuit.

SUMMARY

In accordance with the present teachings, a delta-sigma modulator may generate a bit stream signal from an analog signal by operating according to a modulation period including a sampling period and a filtering period and the delta-sigma modulator may include a digital-to-analog converter (DAC) configured to generate a charge signal according to one of a first reference voltage and a second reference voltage according to the bit stream signal during the sampling period and to output a signal generated according to the charge signal and the other of the first reference voltage and the second reference voltage; a loop filter configured to generate a sampling signal corresponding to the analog signal during the sampling period and to filter an output from the DAC and a signal generated according to the sampling signal during the filtering period; and a quantizer configured to generate the bit stream signal according to an output from the loop filter in the modulation period.

In accordance with the present teachings, an analog-to-digital converter (ADC) may include a delta-sigma modulator configured to generate a bit stream signal from an analog signal by operating according to a modulation period including a sampling period and a filtering period; and a decimation filter configured to generate a digital signal corresponding to the analog signal by removing noise in the bit stream signal, wherein the delta-sigma modulator may include a digital-to-analog converter (DAC) configured to generate a charge signal according to one of a first reference voltage and a second reference voltage according to the bitstream signal during the sampling period and to output a signal generated according to the charge signal and the other of the first reference voltage or the second reference voltage; a loop filter configured to generate a sampling signal corresponding to the analog signal during the sampling period and to filter an output from the DAC and a signal generated according to the sampling signal during the filtering period; and a quantizer configured to generate the bit stream signal according to an output from the loop filter in the modulation period.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

The following detailed description references the accompanying figures in describing embodiments consistent with this disclosure. The examples of the embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof.

Figure 2:
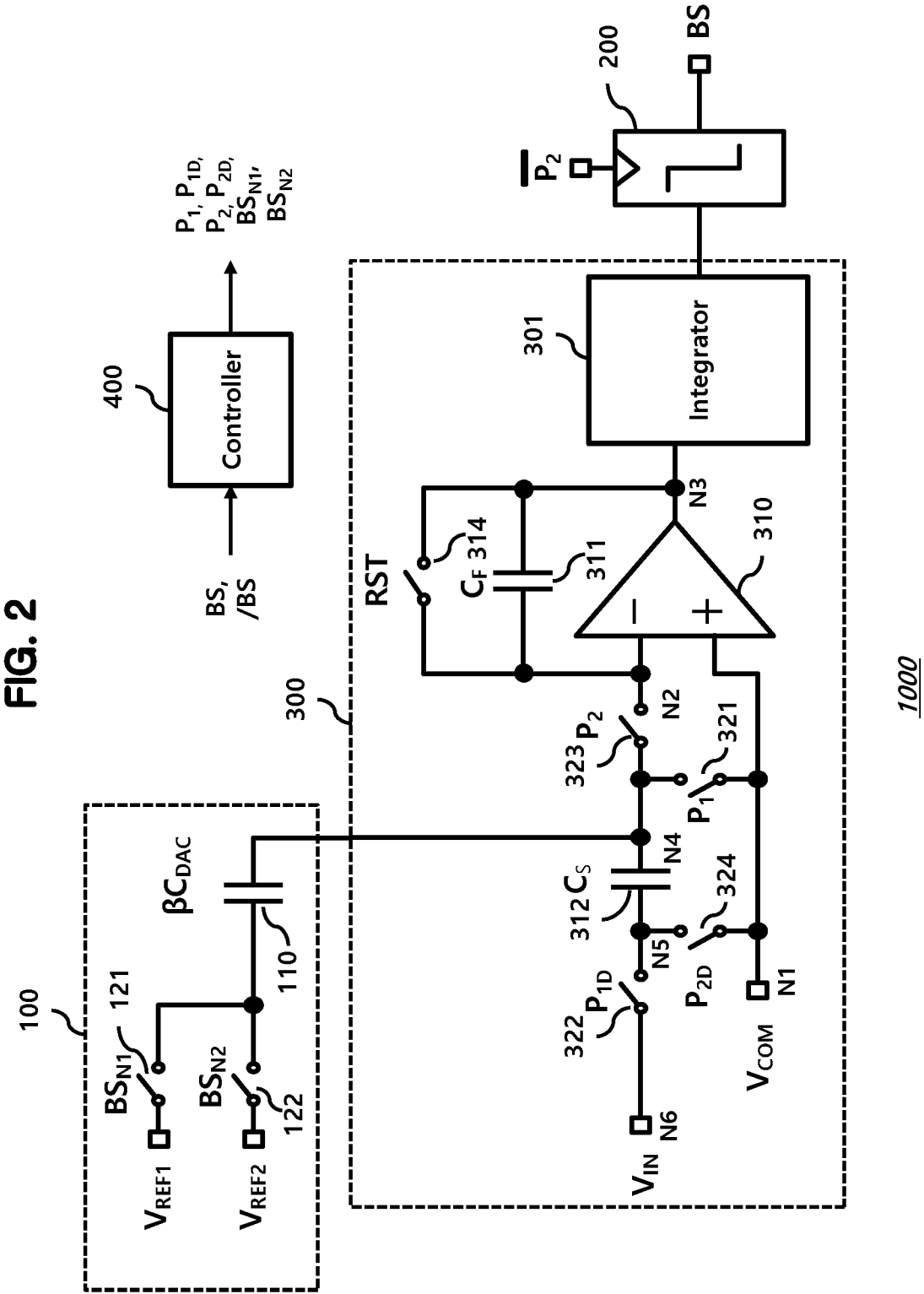
FIG. 2 is a block diagram illustrating a delta-sigma modulator according to an embodiment of the present disclosure.

FIG. 2 is a block diagram of a delta-sigma modulator 1000 according to an embodiment of the present disclosure.

In this embodiment, the delta-sigma modulator 1000 includes a digital-to-analog converter (DAC) 100, a quantizer 200, a loop filter 300, and a controller 400.

The controller 400 outputs a first switching signal $P_1$, a first delayed switching signal $P_{1D}$, a second switching signal $P_2$, and a second delayed switching signal $P_{2D}$.

Figure 3:
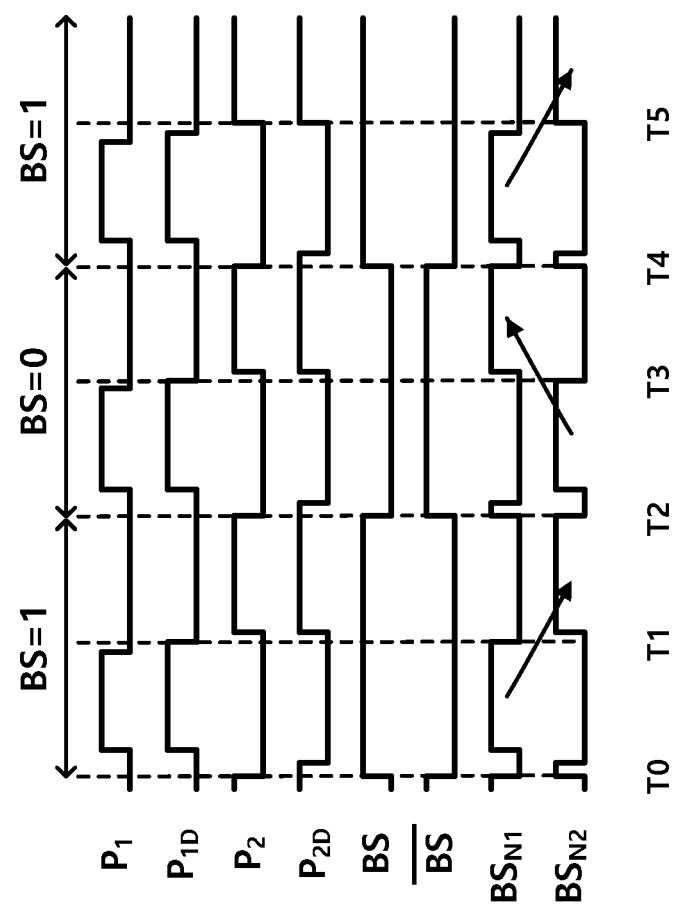
FIG. 3 is a timing diagram illustrating an operation of a controller according to an embodiment of the present disclosure.

FIG. 3 shows a timing diagram of signals output from the controller 400.

As illustrated in FIG. 3, the first delayed switching signal $P_{1D}$ is a signal in which the falling edge of the first switching signal P1 is delayed for a predetermined time, but the rising edges of the two signals $P_1$ and $P_{1D}$ are aligned.

The second delayed switching signal $P_{2D}$ is a signal in which the falling edge of the second switching signal $P_2$ is delayed for a predetermined time, but the rising edges of the two signals $P_2$ and $P_{2D}$ are aligned.

In addition, the rising edge of the first switching signal $P_1$ occurs after the falling edges of the second delayed switching signal $P_{2D}$, and the rising edge of the second switching signal $P_2$ occurs after falling edges of the first delayed switching signal $P_{1D}$.

In FIG. 3, time between T0 to T2 and T2 to T4 corresponds to an operation period of the delta-sigma modulator.

Hereinafter, the operation period of the delta-sigma modulator is referred to as a modulation period.

In addition, the controller 400 outputs a first control signal $BS_{N1}$ and a second control signal $BS_{N2}$ according to the bit stream signal BS, the first switching signal $P_1$, the first delayed switching signal $P_{1D}$, the second switching signal $P_2$, and the second delayed switching signal $P_{2D}$.

Figure 4:
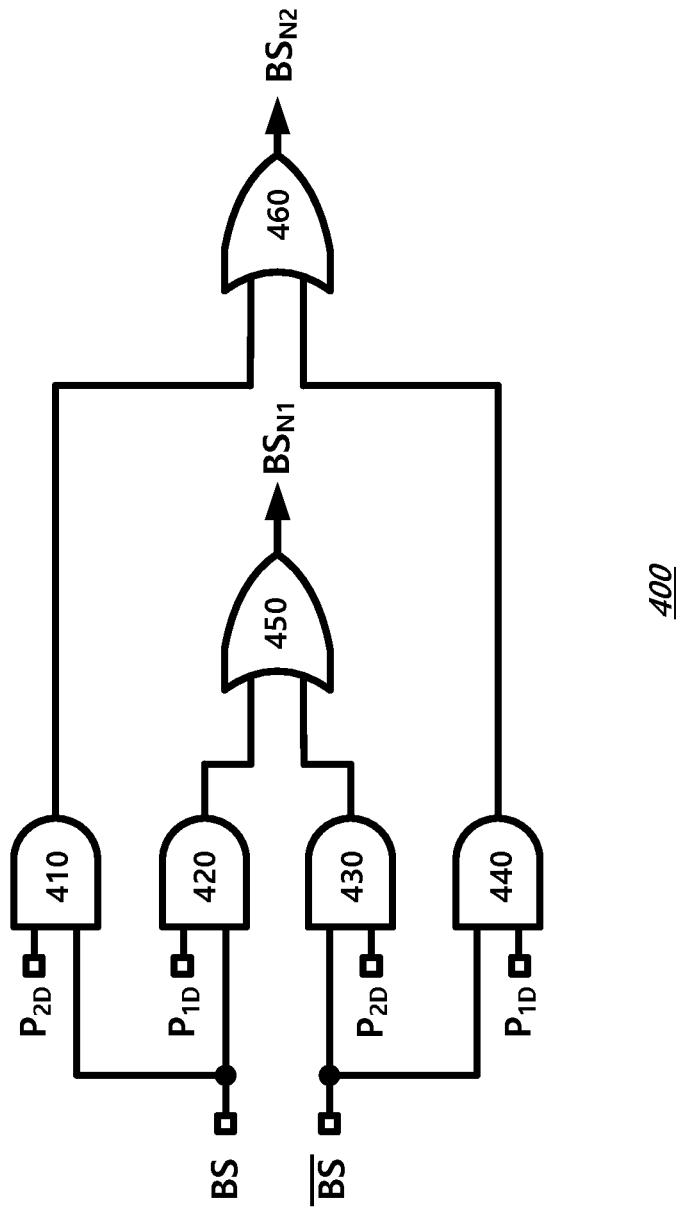
FIG. 4 is a circuit diagram illustrating a controller according to an embodiment of the present disclosure.

FIG. 4 shows a logic circuit diagram of the controller 400 for generating the first control signal $BS_{N1}$ and the second control signal $BS_{N2}$.

The controller 400 includes a first AND gate 410 performing a logical AND operation on the bit stream signal BS and the second delayed switching signal $P_{2D}$, a second AND gate 420 performing a logical AND operation on the bit stream signal BS and the first delayed switching signal $P_{1D}$, a third AND gate 430 performing a logical AND operation on an inverted bit stream signal /BS and the second delayed switching signal $P_{2D}$, and a fourth AND gate 440 performing a logical AND operation on the inverted bit stream signal /BS and the first delayed switching signal $P_{1D}$.

The controller 400 includes a first OR gate 450 performing a logical OR operation on outputs from the second AND gate 420 and the third AND gate 430 to generate the first control signal $BS_{N1}$, and a second OR gate 440 performing a logical OR operation on outputs from the first AND gate 410 and the fourth AND gate 440 to generate the second control signal $BS_{N2}$.

The DAC 100 includes a conversion capacitor 110, a first switch 121, and a second switch 122.

In the drawing, capacitance of the conversion capacitor 110 is denoted by $\beta C_{DAC}$.

The first switch 121 provides a first reference voltage $V_{REF1}$ to a first terminal of the conversion capacitor 110 when the first control signal $BS_{N1}$ is at a high level, and the second switch 122 provides a second reference voltage $V_{REF2}$ greater than the first reference voltage $V_{REF1}$ to the first terminal of the conversion capacitor 110 when the second control signal $BS_{N2}$ is at the high level.

The quantizer 200 quantizes an output of the loop filter 300 at a falling edge of the second switching signal $P_2$ and outputs the bit stream signal BS.

For example, when the output of the loop filter 300 is greater than a common voltage $V_{COM}$, the bit stream signal BS has the high level and when the output of the loop filter 300 is smaller than the common voltage $V_{COM}$, the bit stream signal BS has a low level.

At this time, the common voltage $V_{COM}$ corresponds to an average of the first reference voltage $V_{REF1}$ and the second reference voltage $V_{REF2}$.

The loop filter 300 includes an operational amplifier 310, a feedback capacitor 311 and a sampling capacitor 312.

The common voltage $V_{COM}$ is input to the first node N1.

The operational amplifier 310 includes a first node N1 corresponding to a positive input terminal, a second node N2 corresponding to a negative input terminal, and a third node N3 corresponding to an output terminal.

The feedback capacitor 311 is coupled between the second node N2 and the third node N3 and capacitance thereof is denoted as $C_F$.

The loop filter 300 may further include a first reset switch 314 coupled in parallel to the feedback capacitor 311.

The first reset switch 314 is turned on according to the reset signal RST, and is turned on after a predetermined number of modulation periods to discharge the feedback capacitor 311.

The sampling capacitor 312 is coupled between a fourth node N4 and a fifth node N5 and capacitance thereof is denoted as $C_S$.

The operational amplifier 310 and the feedback capacitor 311 operate as an integrating circuit to integrate a signal from the sampling capacitor 312.

The loop filter 300 includes a sixth node N6 to which an analog signal $V_{IN}$ is provided.

The loop filter 300 further includes third to sixth switches 321 to 324.

The third switch 321 couples the first node N1 and the fourth node N4 when the first switching signal $P_1$ is at the high level.

The fourth switch 322 couples the fifth node N5 and the sixth node N6 when the first delayed switching signal $P_{1D}$ is at the high level.

The fifth switch 323 couples the second node N2 and the fourth node N4 when the second switching signal $P_2$ is at the high level.

The sixth switch 324 couples the first node N1 and the fifth node N5 when the second delayed switching signal $P_{2D}$ is at the high level.

As shown in FIG. 3, when the first switching signal $P_1$ or the first delayed switching signal $P_{1D}$ is at the high level, the second switching signal $P_2$ and the second delayed switching signal $P_{2D}$ are at the low level, and when the second switching signal $P_2$ or the second delayed switching signal $P_{2D}$ is the high level, the first switching signal $P_1$ and the first delayed switching signal $P_{1D}$ are at the low level.

Accordingly, when the third switch 321 or the fourth switch 322 is turned on, the fifth switch 323 and the sixth switch 324 are turned off and when the fifth switch 323 or the sixth switch 324 is turned on, the third switch 321 and the fourth switch 322 are turned off.

The third switch 321 and the fourth switch 322 are turned on in an interval, which may correspond to a sampling period, where the first switching signal $P_1$ and the first delayed switching signal $P_{1D}$ are at the high level, and the sampling capacitor 312 is charged according to the analog signal $V_{IN}$.

The fifth switch 323 and the sixth switch 324 are turned on in an interval, which may correspond to as a filtering period, where the second switching signal $P_2$ and the second delayed switching signal $P_{2D}$ are at the high level, and charges stored in the sampling capacitor 312 is transferred to the feedback capacitor 311.

In the present embodiment, a second terminal of the conversion capacitor 110 is coupled to the fourth node N4.

Accordingly, in the present embodiment, the first reference voltage $V_{REF1}$ or the second reference voltage $V_{REF2}$ is provided to the first terminal of the conversion capacitor 110 during the sampling period.

Charges stored in the conversion capacitor 110 are transferred to the feedback capacitor 311 during the filtering period. At this time, the first reference voltage $V_{REF1}$ or the second reference voltage $V_{REF2}$ is coupled to the first terminal of the conversion capacitor 110.

For example, if the first reference voltage $V_{REF1}$ is coupled to the first terminal of the conversion capacitor 110 during the sampling period, the second reference voltage $V_{REF2}$ is coupled to the first terminal of the conversion capacitor 110 during the filtering period, and if the second reference voltage $V_{REF2}$ is coupled to the first terminal of the conversion capacitor 110 during the sampling period, the first reference voltage $V_{REF1}$ is coupled to the first terminal the conversion capacitor 110 during the filtering period.

As described above, the first reference voltage $V_{REF1}$ or the second reference voltage $V_{REF2}$ rather than the common voltage $V_{COM}$ is provided to the first terminal of the conversion capacitor 110 during the filtering period.

Because the common voltage $V_{COM}$ is the average of the first reference voltage $V_{REF1}$ and the second reference voltage $V_{REF2}$, the feedback capacitor 311 of the present embodiment is provided with about twice the charge of the prior art when capacitance of the conversion capacitor 110 is the same.

Accordingly, the same amount of charges may be transferred in the present embodiment while reducing capacitance of the conversion capacitor 110 by half in the present embodiment.

Hereinafter, an operation in which the sampling capacitor 312 and the conversion capacitor 110 are charged during the sampling period is referred as a sampling operation, and an operation in which charges of the sampling capacitor 312 and the conversion capacitor 110 are transferred to the feedback capacitor 311 to be filtered during the filtering period is referred as a filtering operation.

When the first reference voltage $V_{REF1}$ is mVDD and the second reference voltage $V_{REF2}$ is nVDD, a voltage $V_O$ output from the operational amplifier 310 affected by the DAC 100 receiving the first reference voltage $V_{REF1}$ or the second reference voltage $V_{REF2}$ during a modulation period is expressed like the following equations 1 and 2, where m and n are real numbers.

Equation 1 corresponds to a case where the bit stream signal BS is at the high level corresponding to a logic "1", and equation 2 corresponds to a case where the bit stream signal BS is at the low level corresponding to a logic "0".

$$V_{O,BS=1} = \beta \frac{C_{DAC} V_{DD}}{C_F}(n-m), \beta = 0.5 \quad \text{[Equation 1]}$$

$$V_{O,BS=0} = \beta \frac{C_{DAC} V_{DD}}{C_F}(m-n), \beta = 0.5 \quad \text{[Equation 2]}$$

As described above, the present invention can achieve the same charge transfer effect while reducing capacitance of the conversion capacitor 110 in half compared that of the prior art.

When capacitance of the conversion capacitor 110 is reduced, influence of noise in the reference voltage is also reduced.

As can be seen from Equations 1 and 2, in order to further reduce capacitance of the conversion capacitor 110 for reducing the influence of noise while transferring same amount of charge, the reference voltage may be increased.

That is, when capacitance of the conversion capacitor 110 is decreased by $\alpha$ ($0<\alpha<1$), the magnitudes of the first reference voltage $V_{REF1}$ and the second reference voltage $V_{REF2}$ may be increased by $1/\alpha$.

For example, when the capacitance of the conversion capacitor 110 is changed to $\alpha$CDAC in Equations 1 and 2, the first reference voltage $V_{REF1}$ may be changed to mVDD/$\alpha$ and the second reference voltage $V_{REF2}$ may be changed to nVDD/$\alpha$.

In this case, the influence of noise applied to the reference voltage can be further reduced.

The loop filter 300 may further include an integrator 301 integrating the output of the operational amplifier 310.

Depending on embodiments, the integrator 301 may be omitted or one or more additional integrators may be included to be coupled between the integrator 301 and the quantizer 200.

An ADC may comprise the delta-sigma modulator 1000 in FIG. 2 and a decimation filter (not shown) that performs decimation filtering on the bit stream signal BS output from the delta-sigma modulator 1000.

Figure 1:
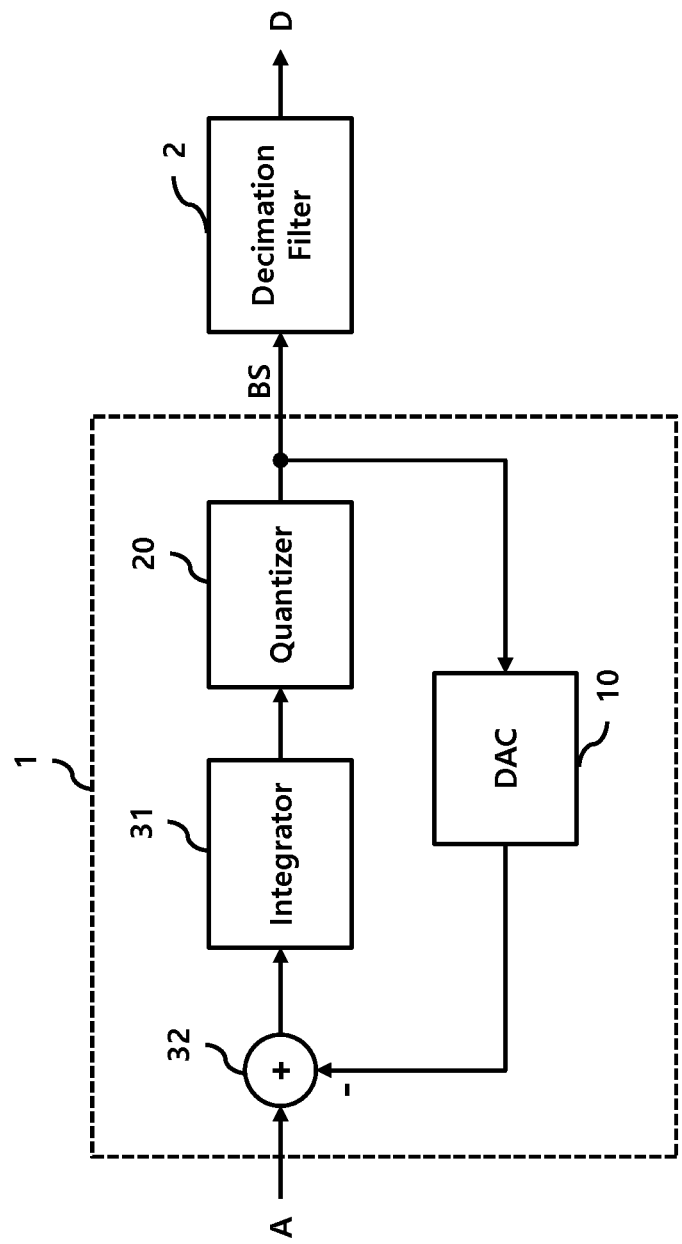
FIG. 1 is a block diagram illustrating a conventional analog-to-digital converter.

Since a decimation filter can be easily known from the prior art as shown in FIG. 1, a detailed description thereof is not repeated.

Figure 5:
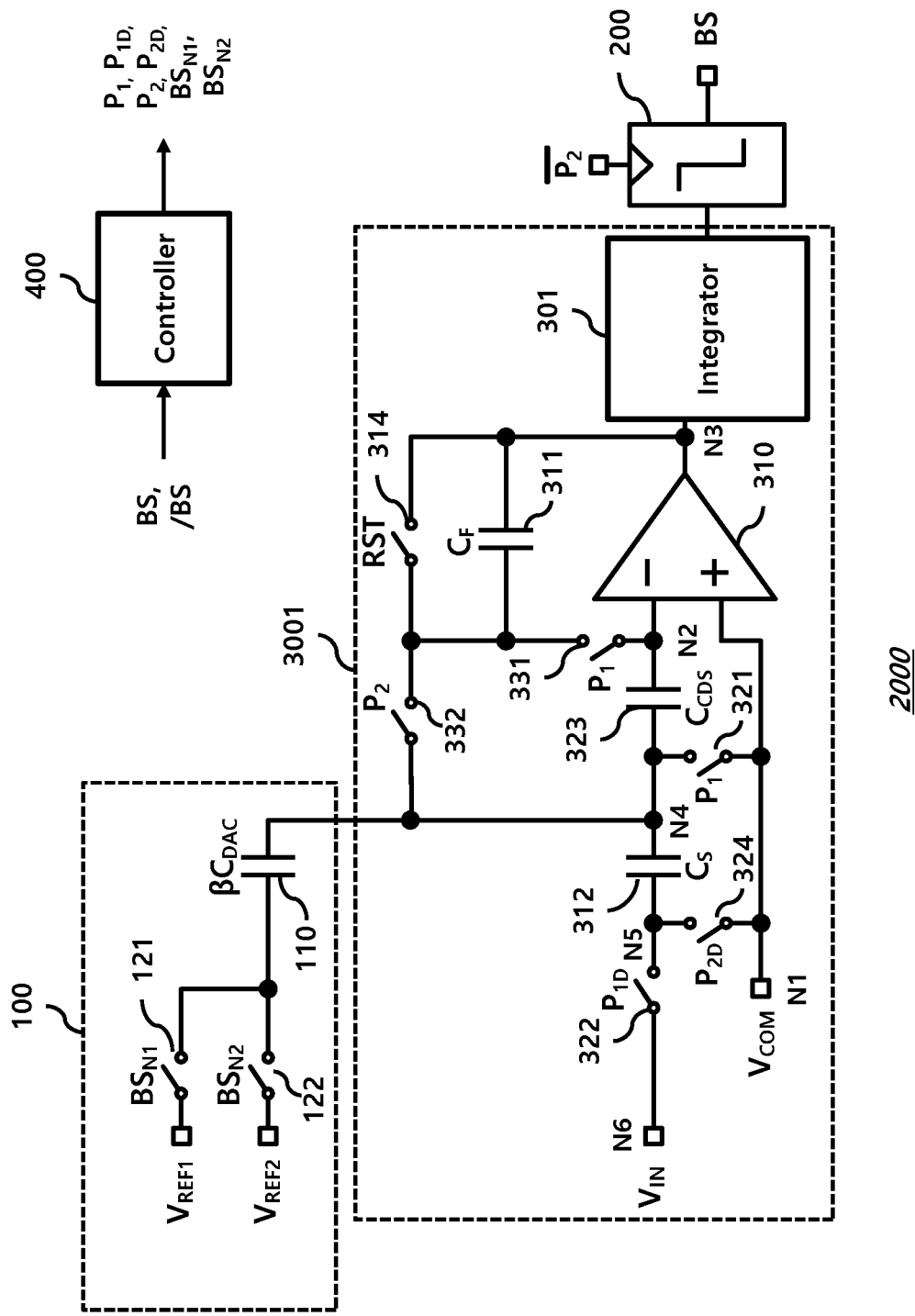
FIGS. 5 and 6 are block diagrams illustrating a delta-sigma modulator according to an embodiment of the present disclosure.

FIG. 5 is a circuit diagram illustrating a delta-sigma modulator 2000 according to another embodiment of the present disclosure.

In the embodiment of FIG. 5, a correlated double sampling (CDS) technique is additionally applied to solve an offset problem existing in the operational amplifier 310.

In this embodiment, the loop filter 300 further includes a CDS capacitor 323, a seventh switch 331, and an eighth switch 332.

The CDS capacitor 323 is coupled between the second node N2 and the fourth node N4.

In this embodiment, a first terminal of the feedback capacitor 311 is coupled to the third node N3.

The seventh switch 331 is turned on when the first switching signal P1 is at the high level and is coupled between the second node N2 and a second terminal of the feedback capacitor 311.

The eighth switch 332 is turned on when the second switching signal P2 is at the high level and is coupled between the fourth node N4 and the second terminal of the feedback capacitor 311.

In the sampling period, the seventh switch 331 is turned on and the eighth switch 332 is turned off.

At this time, the CDS capacitor 323 is coupled between the first node N1 and the second node N2.

Accordingly, charge corresponding to an offset component of the operational amplifier 310 is charged in the CDS capacitor 323.

In the filtering period, the seventh switch 331 is turned off and the eighth switch 332 is turned on so that charge stored in the CDS capacitor 323 is transferred to the feedback capacitor 311.

Accordingly, an integral operation may be performed in a direction in which the offset component of the operational amplifier 310 is removed.

Other operations are substantially the same as the embodiment shown in FIG. 2, and thus duplicate description is not repeated.

Figure 6:
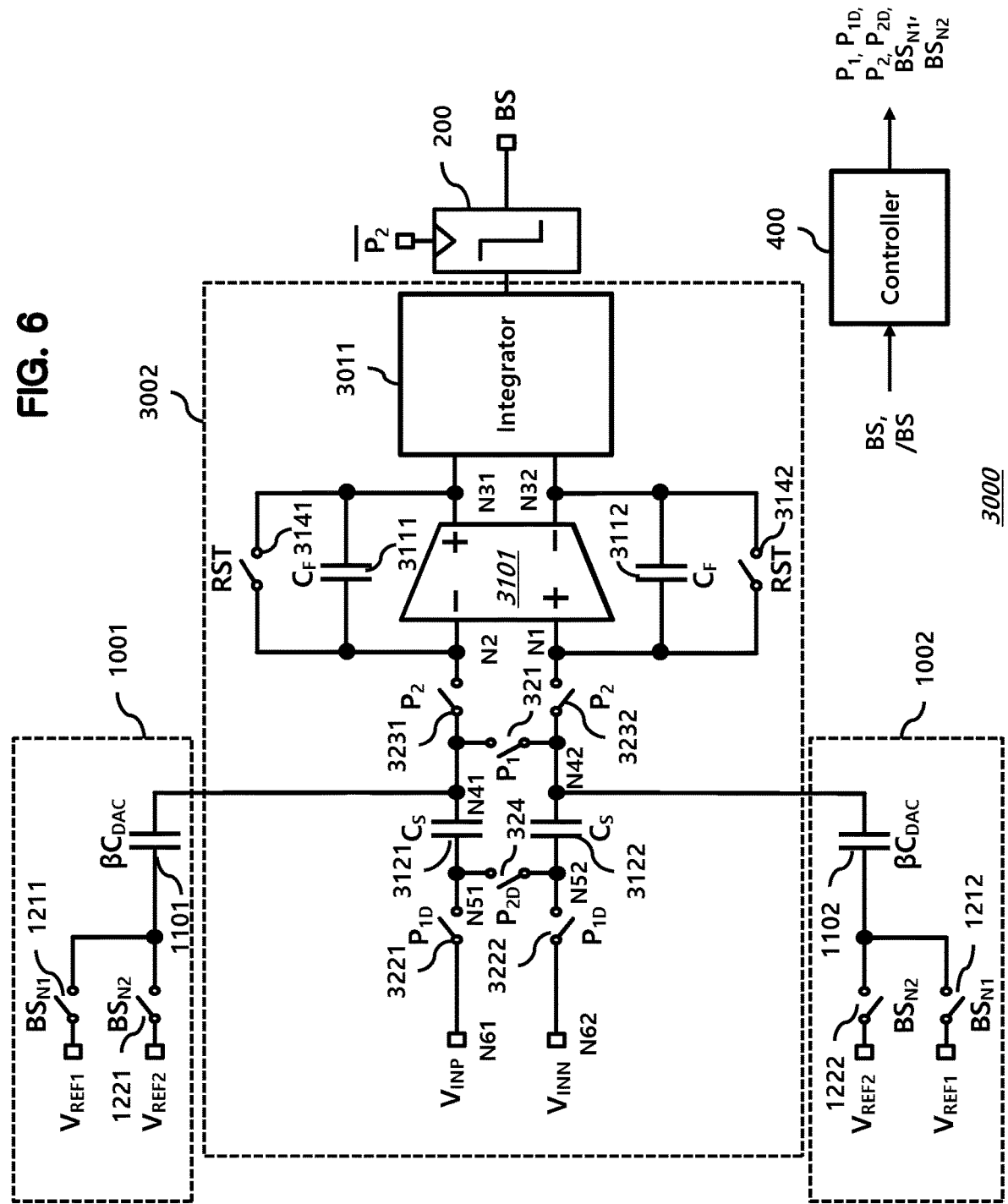

FIG. 6 is a circuit diagram of a delta-sigma modulator 3000 according to another embodiment of the present disclosure.

The delta-sigma modulator 3000 in FIG. 6 is a modification of the delta-sigma modulator 1000 in FIG. 2 into a differential form and operations thereof are substantially the same.

In this embodiment, the delta-sigma modulator 3000 includes a first DAC 1001, a second DAC 1002, a quantizer 200, a loop filter 3002, and a controller 400.

The first DAC 1001 has the same configuration as the DAC 100 disclosed in FIG. 2.

The first DAC 1001 includes a first conversion capacitor 1101, an 11th switch 1211, and a 12th switch 1221.

The 11th switch 1211 provides the first reference voltage $V_{REF1}$ to a first terminal of the first conversion capacitor 1101 when the first control signal $BS_{N1}$ is at the high level, and the 12th switch 1221 provides the second reference voltage $V_{REF2}$ to the first terminal of the first conversion capacitor 1101 when the second control signal $BS_{N2}$ is at the high level.

The second DAC 1002 has substantially the same configuration as the first DAC 1001.

The second DAC 1002 includes a second conversion capacitor 1102, a 21st switch 1212, and a 22nd switch 1222.

The 21st switch 1212 provides the first reference voltage $V_{REF1}$ to a first terminal of the second conversion capacitor 1102 when the first control signal $BS_{N1}$ is at the high level, and the 22nd switch 1222 the second reference voltage $V_{REF2}$ to the first terminal of the second conversion capacitor 1102 when the second control signal $BS_{N2}$ is at the high level.

The loop filter 3001 includes an operational amplifier 3101, a first feedback capacitor 3111, a second feedback capacitor 3112, a first reset switch 3141, a second reset switch 3142, and a first sampling capacitor 3121, and a second sampling capacitor 3122.

The operational amplifier 3101 amplifies voltage difference between the first node N1 and the second node N2 coupled to the differential input terminals thereof and outputs a differential signal to a first output node N31 and a second output node N32 which are coupled to the differential output terminals.

The first feedback capacitor 3111 is coupled between the second node N2 and the first output node N31, and the first reset switch 3141 is coupled in parallel to the first feedback capacitor 3111. The first feedback capacitor 3111 is discharged when the reset signal RST is at the high level.

The second feedback capacitor 3112 is coupled between the first node N1 and the second output node N32, and the second reset switch 3142 is coupled in parallel to the second feedback capacitor 3112. The first feedback capacitor 3112 is discharged when the reset signal RST is at the high level.

The first sampling capacitor 3121 is coupled between a 41st node N41 and a 51st node N51, and the 41st node N41 is coupled to a second terminal of the first conversion capacitor 1101.

The second sampling capacitor 3122 is coupled between a 42nd node N42 and a 52nd node N52, and a 42nd node N42 is coupled to a second terminal of the second conversion capacitor 1102.

The loop filter 3001 further includes a third switch 321, a 41st switch 3221, a 42nd switch 3222, a 51st switch 3231, a 52nd switch 3232, and a sixth switch 324.

The third switch 321 couples the 41st node N41 and the 42nd node N42 when the first switching signal P1 is at the high level.

The 41st switch 3221 couples the 51st node N51 and the 61 node N61 when the first delayed switching signal P1D is at the high level.

The 42nd switch 3222 couples the 52nd node N52 and the 62nd node N62 when the first delayed switching signal P1D is at the high level.

The 51st switch 3231 couples the second node N2 and the 41st node N41 when the second switching signal P2 is at the high level.

The 52nd switch 3232 couples the first node N1 and the 42nd node N42 when the second switching signal P2 is at the high level.

The sixth switch 324 couples the 51st node N51 and the 52nd node N52 when the second delayed switching signal P2D is at the high level.

Differential analog signals VINP and VINN are input to the 61st node N61 and the 62nd node N62.

The integrator 3011 integrates the differential output of the operational amplifier 3101.

Depending on embodiments, the integrator 3011 may be omitted or one or more integrators may be further included between the integrator 3011 and the quantizer 200.

The quantizer 200 outputs the bit stream signal BS by comparing an output of the loop filter 3002 with the common voltage VCOM at a falling edge of the second control signal P2.

The operation of the controller 400 is the same as described with reference to FIGS. 2 to 4.

The loop filter 3002 also performs a sampling operation and a filtering operation during a modulation period.

As described above, since the embodiment of FIG. 6 differs only in that it is a differential type, descriptions thereof will not be repeated.

Figure 7:
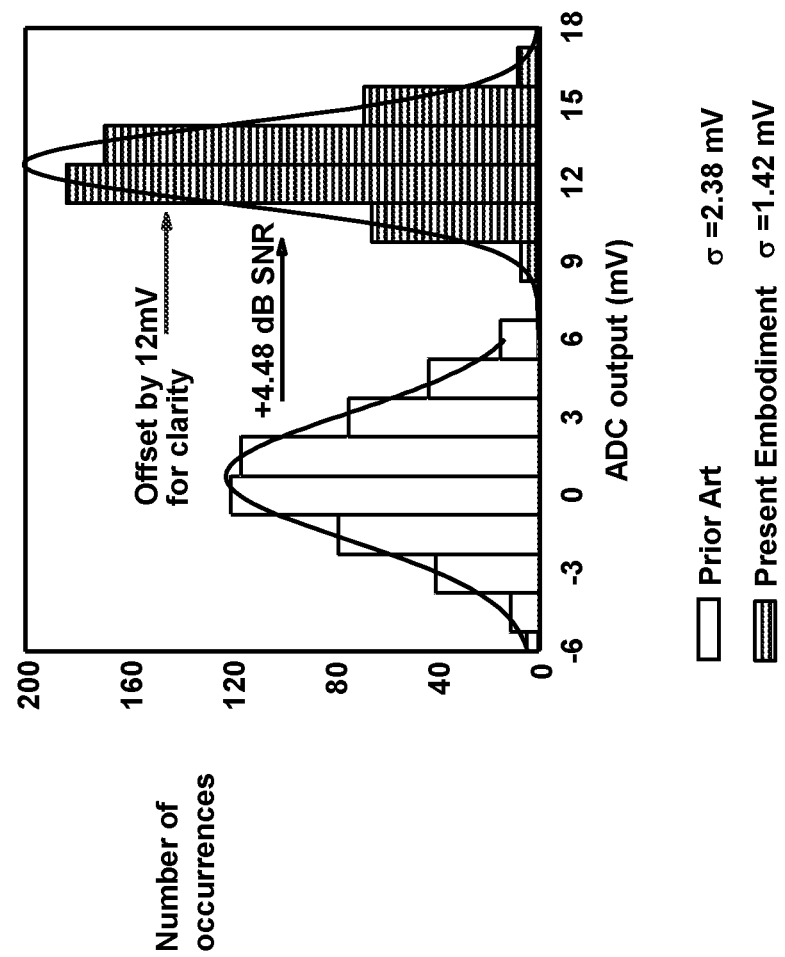
FIG. 7 is a graph illustrating an effect of a delta-sigma modulator according to an embodiment of the present disclosure.

FIG. 7 is a graph showing an effect of the present embodiment.

The histogram of FIG. 7 shows a distribution of output voltages of the ADC affected by noise of a reference voltage.

In FIG. 7, a histogram on the left side corresponds to an ADC according to a prior art, and a histogram on the right side corresponds to an ADC according to the present embodiment.

The graph corresponding to the present embodiment is expressed in a state where an offset is given by 12 mV for convenience.

In the prior art, the standard deviation was measured as 2.38 mV, but in the case of the present embodiment, the standard deviation was measured as 1.42 mV.

In addition, in the present embodiment, the signal-to-noise ratio (SNR) is improved by 4.48 dB.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A delta-sigma modulator generating a bit stream signal from an analog signal by operating according to a modulation period including a sampling period and a filtering period, the delta-sigma modulator comprising:
   a digital-to-analog converter (DAC) configured to generate a charge signal according to one of a first reference voltage and a second reference voltage according to the bit stream signal during the sampling period and to output a signal generated according to the charge signal and the other of the first reference voltage and the second reference voltage;

a loop filter configured to generate a sampling signal corresponding to the analog signal during the sampling period and to filter an output from the DAC and a signal generated according to the sampling signal during the filtering period; and a quantizer configured to generate the bit stream signal according to an output from the loop filter in the modulation period.

2. The delta-sigma modulator of claim 1, wherein the DAC includes:
a conversion capacitor;
a first switch coupled to a first terminal of the conversion capacitor to provide the first reference voltage; and
a second switch coupled to the first terminal of the conversion capacitor to provide the second reference voltage.

3. The delta-sigma modulator of claim 2, wherein when the bit stream signal is at a high level, the first switch provides the first reference voltage to the first terminal of the conversion capacitor during the sampling period and the second switch provides the second reference voltage to the first terminal of the conversion capacitor during the filtering period.

4. The delta-sigma modulator of claim 3, wherein when the bit stream signal is at a low level, the first switch provides the first reference voltage to the first terminal of the conversion capacitor during the filtering period and the second switch provides the second reference voltage to the first terminal of the conversion capacitor during the sampling period.

5. The delta-sigma modulator of claim 2, wherein the first reference voltage and the second reference voltage are increased by $1/\alpha$, when capacitance of the conversion capacitor is decreased by $\alpha$, where $\alpha$ is a real number between 0 and 1.

6. The delta-sigma modulator of claim 1, wherein the loop filter comprises:
a sampling capacitor generating the sampling signal by charging the analog signal during the sampling period; and
an integrating circuit configured to filter an output from the sampling capacitor and an output from the DAC during the filtering period.

7. The delta-sigma modulator of claim 6, wherein the integrating circuit comprises:
an operational amplifier including a negative input terminal receiving an output from the sampling capacitor and an output from the DAC during the filtering period; and
a feedback capacitor including a first terminal coupled to an output terminal of the operational amplifier and a second terminal coupled to the negative input terminal.

8. The delta-sigma modulator of claim 7, further comprising:
a CDS capacitor coupled between the negative input terminal and a positive input terminal of the operation amplifier during the sampling period and coupled between a second terminal of the feedback capacitor and the negative input terminal during the filtering period.

9. The delta-sigma modulator of claim 7, wherein the positive input terminal is coupled to a common voltage corresponding to an average of the first reference voltage and the second reference voltage.

10. The delta-sigma modulator of claim 6, wherein the loop filter further includes an integrator for integrating an output from the integrating circuit.

11. An analog-to-digital converter (ADC) comprising:
a delta-sigma modulator configured to generate a bit stream signal from an analog signal by operating according to a modulation period including a sampling period and a filtering period; and
a decimation filter configured to generate a digital signal corresponding to the analog signal by removing noise in the bit stream signal, wherein the delta-sigma modulator includes:
a digital-to-analog converter (DAC) configured to generate a charge signal according to one of a first reference voltage and a second reference voltage according to the bitstream signal during the sampling period and to output a signal generated according to the charge signal and the other of the first reference voltage or the second reference voltage;
a loop filter configured to generate a sampling signal corresponding to the analog signal during the sampling period and to filter an output from the DAC and a signal generated according to the sampling signal during the filtering period; and
a quantizer configured to generate the bit stream signal according to an output from the loop filter in the modulation period.

12. The ADC of claim 11, wherein the DAC includes:
a conversion capacitor;
a first switch coupled to a first terminal of the conversion capacitor to provide the first reference voltage; and
a second switch coupled to the first terminal of the conversion capacitor to provide the second reference voltage.

13. The ADC of claim 12, wherein when the bitstream signal is at a high level, the first switch provides the first reference voltage to the first terminal of the conversion capacitor during the sampling period and the second switch provides the second reference voltage to the first terminal of the conversion capacitor during the filtering period.

14. The ADC of claim 13, wherein when the bitstream signal is at a low level, the first switch provides the first reference voltage to the first terminal of the conversion capacitor during the filtering period and the second switch provides the second reference voltage to the first terminal of the conversion capacitor during the sampling period.

15. The ADC of claim 12, wherein the first reference voltage and the second reference voltage are increased by $1/\alpha$, when capacitance of the conversion capacitor is decreased by $\alpha$, where $\alpha$ is a real number between 0 and 1.

16. The ADC of claim 11, wherein the loop filter comprises:
a sampling capacitor generating the sampling signal by charging the analog signal during the sampling period; and
an integrating circuit configured to filter an output from the sampling capacitor and an output from the DAC during the filtering period.

17. The ADC of claim 16, wherein the integrating circuit comprises:
an operational amplifier including a negative input terminal receiving an output from the sampling capacitor and an output from the DAC during the filtering period; and
a feedback capacitor including a first terminal coupled to an output terminal of the operational amplifier and a second terminal coupled to the negative input terminal.

18. The ADC of claim 17, further comprising:
a CDS capacitor coupled between the negative input terminal and a positive input terminal of the operation amplifier during the sampling period and coupled between a second terminal of the feedback capacitor and the negative input terminal during the filtering period.

19. The ADC of claim 17, wherein the positive input terminal is coupled to a common voltage corresponding to an average of the first reference voltage and the second reference voltage.

20. The ADC of claim 16, wherein the loop filter further includes an integrator for integrating an output from the integrating circuit.

* * * * *